(12) United States Patent
Fan et al.

(10) Patent No.: US 7,579,925 B2
(45) Date of Patent: Aug. 25, 2009

(54) ADJUSTING A CHARACTERISTIC OF A CONDUCTIVE VIA STUB IN A CIRCUIT BOARD

(75) Inventors: Jun Fan, San Marcos, CA (US); Arthur Ray Alexander, Valley Center, CA (US); James Knighten, Poway, CA (US); Norman Smith, San Marcos, CA (US)

(73) Assignee: Teradata US, Inc., Miamisburg, OH (US)

( * ) Notice: Subject to any disclaimer, the term of this patent is extended or adjusted under 35 U.S.C. 154(b) by 163 days.

(21) Appl. No.: 11/557,985

(22) Filed: Nov. 9, 2006

(65) Prior Publication Data

US 2007/0103251 A1 May 10, 2007

(51) Int. Cl.
*H03H 7/38* (2006.01)
*H01P 3/08* (2006.01)

(52) U.S. Cl. .......................... 333/33; 333/246

(58) Field of Classification Search ............... 333/33, 333/238, 246, 260; 174/266, 262
See application file for complete search history.

(56) References Cited

U.S. PATENT DOCUMENTS 6,359,234 B1 * 3/2002 Kouda .................. 174/260
6,778,043 B2 * 8/2004 Stoddard et al. ............ 333/246

* cited by examiner

*Primary Examiner*—Dean O Takaoka
(74) *Attorney, Agent, or Firm*—Shelston IP

(57) ABSTRACT

A circuit board construction which reduces unwanted electrical effects and lower signal quality resulting from the use of vias in relatively thick circuit boards or in circuit boards carrying signals of relatively high frequency. The circuit board includes a through-hole in the circuit board substrate for carrying a conductive via stub, the stub having an inherent stub characteristic; and a compensation element, such as a surface mount capacitor, positioned on the substrate such that when the stub is carried by the through-hole the inherent stub characteristic is adjusted to define a compensated stub characteristic.

6 Claims, 8 Drawing Sheets

ADJUSTING A CHARACTERISTIC OF A
CONDUCTIVE VIA STUB IN A CIRCUIT
BOARD

BACKGROUND

It is known to provide a conductive stub in a through-hole formed in the circuit board. The resulting component is commonly referred to as plated through-hole (PTH) via. These are commonly used in circuit boards to allow transfer of signals between circuit board layers. They are also used for connecting selected circuit board planes. Vias allow for beneficial signal routing densities and layer counts. Further, they are relatively easy to manufacture and cost effective—particularly in cases where aspect ratios are below 10:1.

Potential problems arise where vias are used in relatively thick circuit boards—such as backpanels—or in circuit boards carrying signals of relatively high frequency. An unused portion of a via—or more specifically a via stub—often behaves as a transmission line in parallel with the signal transmission path. This is known to cause unwanted electrical effects that impact on signal quality. Further, the signal transmission path is often loaded in an undesirable manner at higher signal frequencies.

A known solution is to reduce the length of the subs. For example: back-drilling to remove unused portions of the stubs. It is also possible to use blind or buried vias as an alternative. These approaches are effective, but costly in manufacturing and create a need for increased efforts in circuit board design. Further, back-drilling is prone to errors which irreversibly damage boards. For example, drill misregistration, unsatisfactory drill depths, and slanted drilling. Such errors adversely affect manufacturing yield.

SUMMARY

It is an object of the present invention to overcome or ameliorate at least one of the disadvantages of the prior art, or to provide a useful alternative.

In accordance with a first aspect of the invention, there is provided a circuit board including:

a substrate;

a through-hole in the substrate for carrying a conductive via stub, the stub having an inherent stub characteristic; and a compensation element positioned on the substrate such that when the stub is carried by the through-hole the inherent stub characteristic is adjusted to define a compensated stub characteristic.

Preferably the inherent stub characteristic is adjusted to increase the suitability of the circuit board for a predetermined application. In some embodiments the inherent stub characteristic is an inherent resonant frequency and the compensated stub characteristic is a compensated resonant frequency.

Preferably the stub includes a primary portion defined on a signal path for transmitting a signal having a predetermined signal frequency range and the compensated resonant frequency is outside of the predetermined signal frequency range. More preferably the stub has a plurality of inherent resonant frequencies and the compensation element adjusts this plurality of inherent resonant frequencies to define a respective plurality of compensated resonant frequencies outside of the predetermined signal frequency range.

Preferably the compensation element includes a capacitive element for loading the carried stub.

In some embodiments the compensation element is a surface mount capacitor mounted to the substrate for terminating the stub. Preferably the stub has an open end at a backing surface of the substrate, and the surface mount capacitor is mounted to the backing surface. More preferably the open end includes a pad on the backing surface, and the surface mount capacitor is mounted to the pad.

In some embodiments the stub includes a pad at an open end, and the capacitive element is defined by a dielectric relationship between the pad and a ground plane on the substrate. Preferably the dielectric relationship is provided by an inherent dielectric property of the pad. More preferably the dielectric relationship is provided by an inherent dielectric property of one or more layers of the substrate.

In other embodiments the capacitive element includes one or more simulated embedded capacitors in the substrate substantially adjacent the through-hole.

In further embodiments the substrate includes one or more capacitive layers for defining the capacitive element. Preferably the one or more capacitive layers include a high dielectric laminate. More preferably the one or more capacitive layers include a planar embedded capacitor laminate.

According to a second aspect of the invention, there is provided a method for adjusting an inherent characteristic of a via stub when that stub is carried by a substrate, the method including the steps of:

providing a through-hole in the substrate for carrying the via stub;

positioning on the circuit board a compensation element for adjusting the inherent characteristic to define a compensated characteristic.

According to a further aspect of the invention, there is provided a circuit board for carrying a signal having a predefined bandwidth, the circuit board including:

a plated through hole via having an inherent resonant frequency; and a compensation element for influencing the via such that the inherent resonant frequency is shifted outside of the predefined bandwidth.

Preferably the compensation element is a capacitive element.

BRIEF DESCRIPTION OF THE DRAWINGS

Benefits and advantages of the present invention will become apparent to those skilled in the art to which this invention relates from the subsequent description of exemplary embodiments and the appended claims, taken in conjunction with the accompanying drawings, in which:

DETAILED DESCRIPTION

Figure 1:
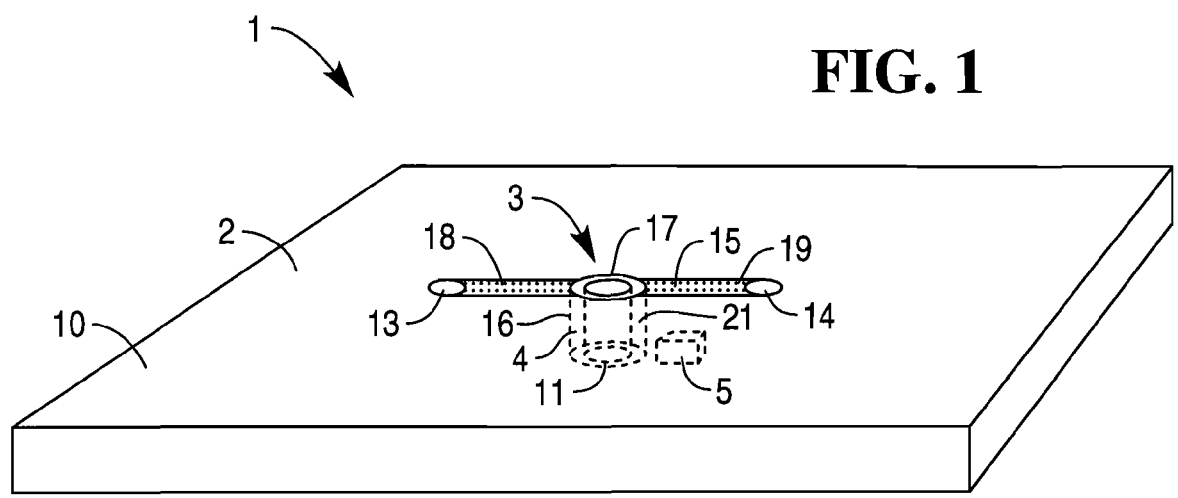
FIG. 1 is a perspective view of a circuit board in accordance with an embodiment of the invention.

Referring to the drawings, it will be appreciated that, in the different figures, corresponding features have been denoted by corresponding reference numerals. It will further be appreciated that the figures are generally not drawn not scale, and provided primarily for purposes of schematic illustration.

Figure 2:
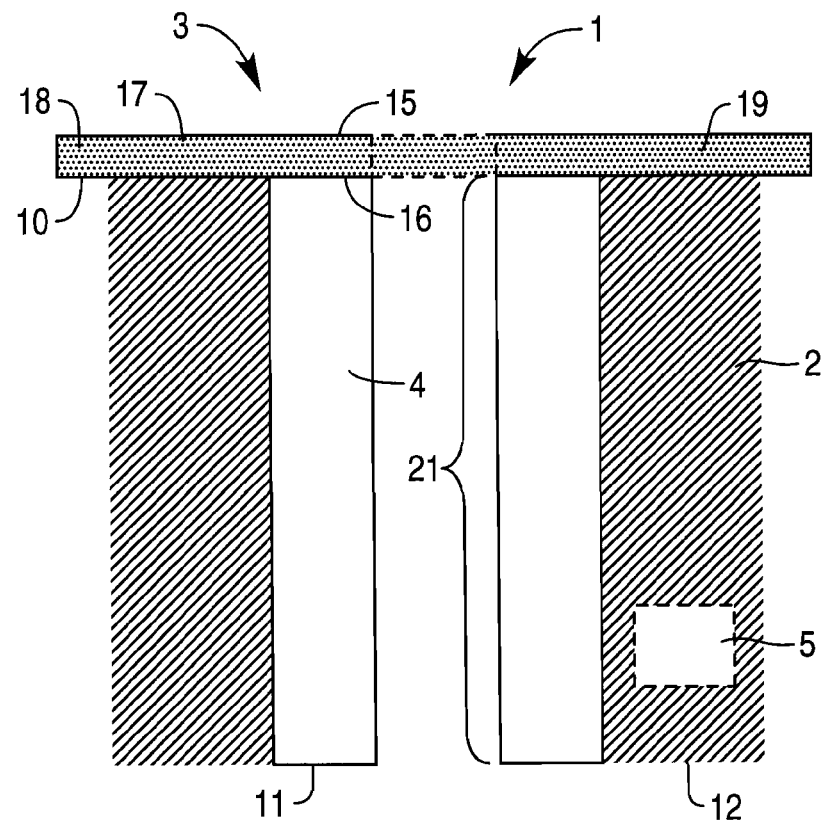
FIG. 2 is a cutaway view of the circuit board of FIG. 1.

FIGS. 1 and 2 illustrate a circuit board 1 including a substrate 2. A through-hole 3 is provided in substrate 2 for carrying a conductive via stub 4. This via stub has an inherent stub characteristic. A compensation element 5 is positioned on substrate 2 such that when stub 4 is carried by hole 3 the inherent stub characteristic is adjusted to define a compensated stub characteristic. Typically, the inherent stub characteristic is adjusted to increase the suitability of the circuit board for a predetermined application.

In the present embodiment the inherent stub characteristic under consideration is an inherent resonant frequency. As such, the relevant compensated stub characteristic is a compensated resonant frequency. Alternate inherent stub characteristics are used in other embodiments.

For the purposes of the present disclosure, a resonant frequency is defined as a signal frequency at which electrical properties of stub 4 cause a resonant effect that adversely affects signal transmission. It is appreciated that some frequencies, which would traditionally be regarded as resonant, do not adversely affect signal transmission. Indeed, these frequencies do not produce a noticeable effect on transmission. Such frequencies are not regarded as "resonant" for the purpose of this disclosure.

For the sake of the present disclosure, the notion of being "on" substrate 2 should be construed broadly to include both external and internal positioning. That is, element 5 is in some cases located on a surface of substrate 2, and in other cases located inside substrate 2.

The term "circuit board" should be construed broadly to include printed circuit boards (PCBs), backpanels, and other physical constructs used to carry conductive materials for the purpose of signal transference. It is appreciated that, in a definitional sense, a circuit board exists regardless of the presence of actual circuitry.

The term "inherent stub characteristic" relates to a characteristic of a stub in absence of effects of compensation element 5. Typically, this is a characteristic of a like stub in a like circuit board that lacks element 5. Assuming the inherent characteristic is quantifiable by a value, adjusting this characteristic involves either increasing or decreasing this value.

In most cases, board 1 includes a plurality of through holes 3 for carrying respective stubs 4, hence providing a plurality of PTH vias. In such cases, one or more elements 5 are provided—depending on the nature of element 5 and the intended purpose of board 1. For example, in one embodiment, element 5 is in the form of a surface mount capacitor, and a single such capacitor is provided for each stub 4. In another embodiment, an element 5 in the form of a single capacitive layer is provided in substrate 2 to influence a plurality of stubs 4. These and other examples are discussed in greater detail further below.

Stub 4 is a generic open-ended cylindrical via stub, as will be known to those skilled in the art. It commences at an upper surface 10 of substrate 2, and includes an open end 11 at a backing surface 12 of substrate 2. In use, a signal having a signal frequency is transmitted on board 1 from a first point 13 to a second point 14 along a signal path, in the form of trace 15. Points 13 and 14 are provided as frames of reference only. However in practice they are typically defined by circuit board components such as other vias, surface mounted components, and so on.

The intersection of the stub 4 and trace 15 defines a launch point 16. A portion 17 of trace 15 conductively connects the trace to the stub, typically including an annular portion on surface 11. The trace also includes a first segment 18 conductively connected to point 13, and a second segment 19 conductively connected to point 14. Trace 15 defines typically a used potion 20 and unused portion 21 of stub 4, the used portion being a portion of stub 4 that is required for signal transmission. Portion 21 is "unused" in the sense that, were it removed, trace 15 is still able to carry a signal from point 13 to point 14. In the example of FIGS. 1 and 2, stub 4 lacks a used potion 20 given that trace 15 is defined wholly on surface 11. An embodiment including a used portion is described below by reference to FIG. 4.

As mentioned above, stub 4 has an inherent resonant frequency. Where a signal of this resonant frequency is applied across point 16, and in absence of element 5, the impedance exhibited at point 16 is a short circuit. This inherent resonant frequency first occurs where the length of stub 4 is approximately one-quarter of the signal wavelength. Inherent resonant frequencies—also referred to as "resonances" occur for lengths of n/4 wavelengths, where "n" is an odd integer. Generally speaking, the difference in frequency between resonances caused by the presence of stub 4 is a function of the length of the stub. The shorter the length, the higher the frequency of the first resonance. A shorter stub also results in a relatively larger difference between frequency values of consecutive resonances.

It will be appreciated that since backpanels are generally thicker than other printed circuit boards, effects of unused via stub portions are more acute with backpanels as compared with other types of boards. The rationale is that lengths of unused via stubs are typically longer than on other types of boards. Backpanels often include vias even when the signal transmission is confined to a single layer. For instance, a signal transmitted through a backpanel often originates on a daughter card, goes into the backpanel through a mated pair of connectors, and continues to another daughter card in reverse sequence of the mated pair of connectors. PTH vias are used to connect the connector pins to board traces and are present even when the signal on the backpanel is confined to a single layer. As such, it is particularly beneficial to use a backpanel in the form of board 1.

Figure 3:
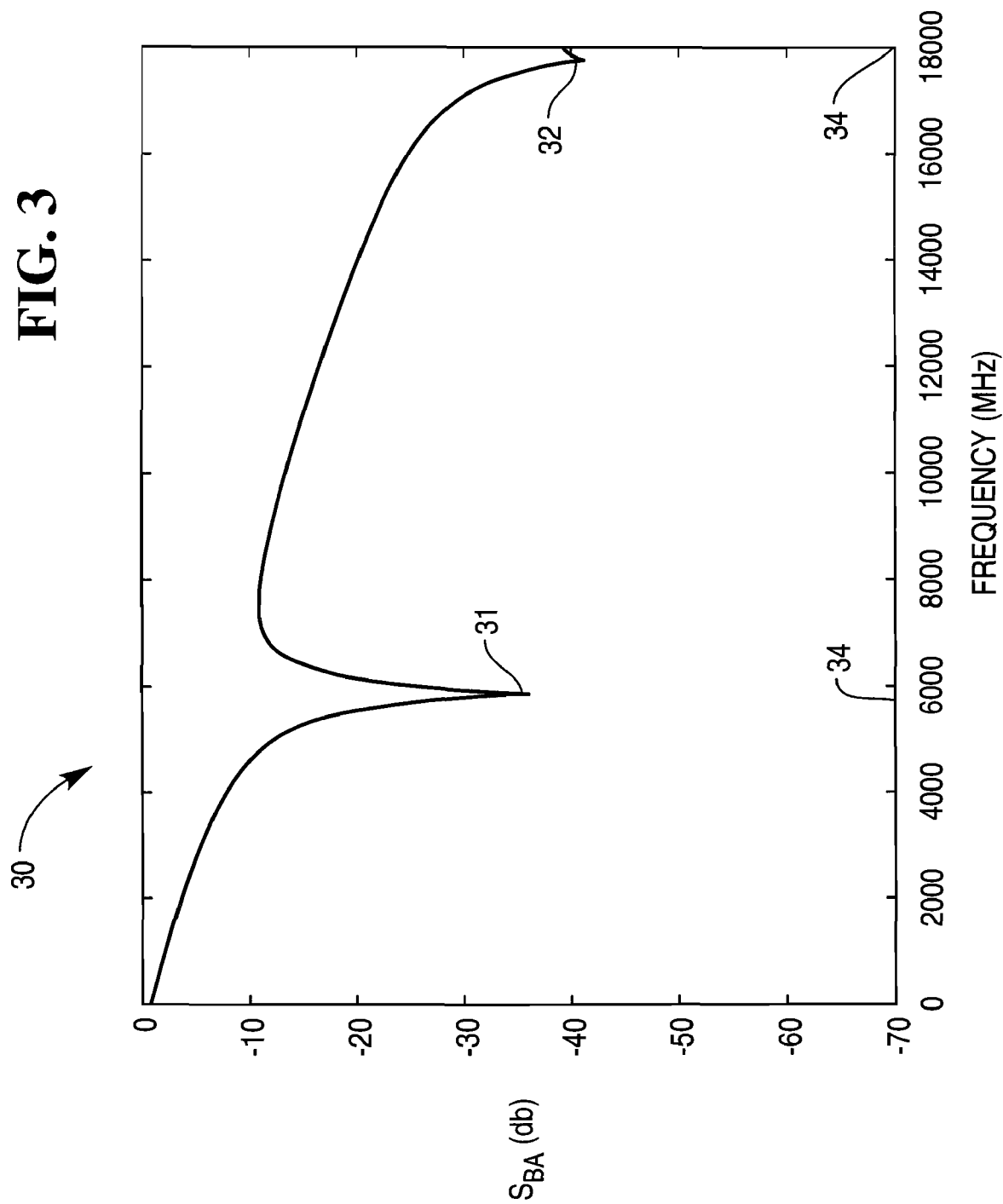
FIG. 3 is a graph showing signal loss behaviors for a trace across a PTH via.

In known circuit boards, resonant frequencies cause difficulties at relatively high signal frequencies. More specifically, when the impedance at point 16 is a short circuit, all signal energy goes to the stub rather than the desired signal path, resulting in significant transmission losses at corresponding frequencies. In this manner, stubs behave as transmission lines rather than as lumped circuit elements at high signal frequencies. An example of this behavior is shown in FIG. 3. FIG. 3 provides a graph 30 plotting the absolute value of $S_{BA}$ against frequency for an exemplary prior art circuit board. $|S_{BA}|$ is indicative of signal transmission loss between a point A and a point B, such as points 13 and 14. Instead of a smooth behavior, $|S_{BA}|$ shows the adverse effects of resonances at points 31 and 32, corresponding to resonant frequencies 33 and 34. These resonances are undesirable for signal transmission because they cause increased signal losses at nearby frequencies. It will be recognized that FIG. 3 illustrates a typical behavior for a prior art circuit board including a standard PTH via and no element 5. This exemplary circuit board lacks suitability for carrying signals having signal frequencies of approximately frequency 33 or 34, or signals being of bandwidth including those frequencies.

Where the length of stub 4 is m/2 wavelengths, "m" being an integer, the impedance at point 16 is an open circuit. When the impedance of the stub at the signal trace is an open circuit, a signal on the trace is substantially not affected given that stub 4 is in parallel to the desired signal path. As foreshadowed above, these frequencies are not regarded as resonant frequencies for the sake of disclosure.

At frequencies that do not correspond to either resonant frequencies or open frequencies, the impedance at point 16 is reactive, alternating between capacitive and inductive. These frequencies are of little interest in context of the present disclosure.

Figure 4:
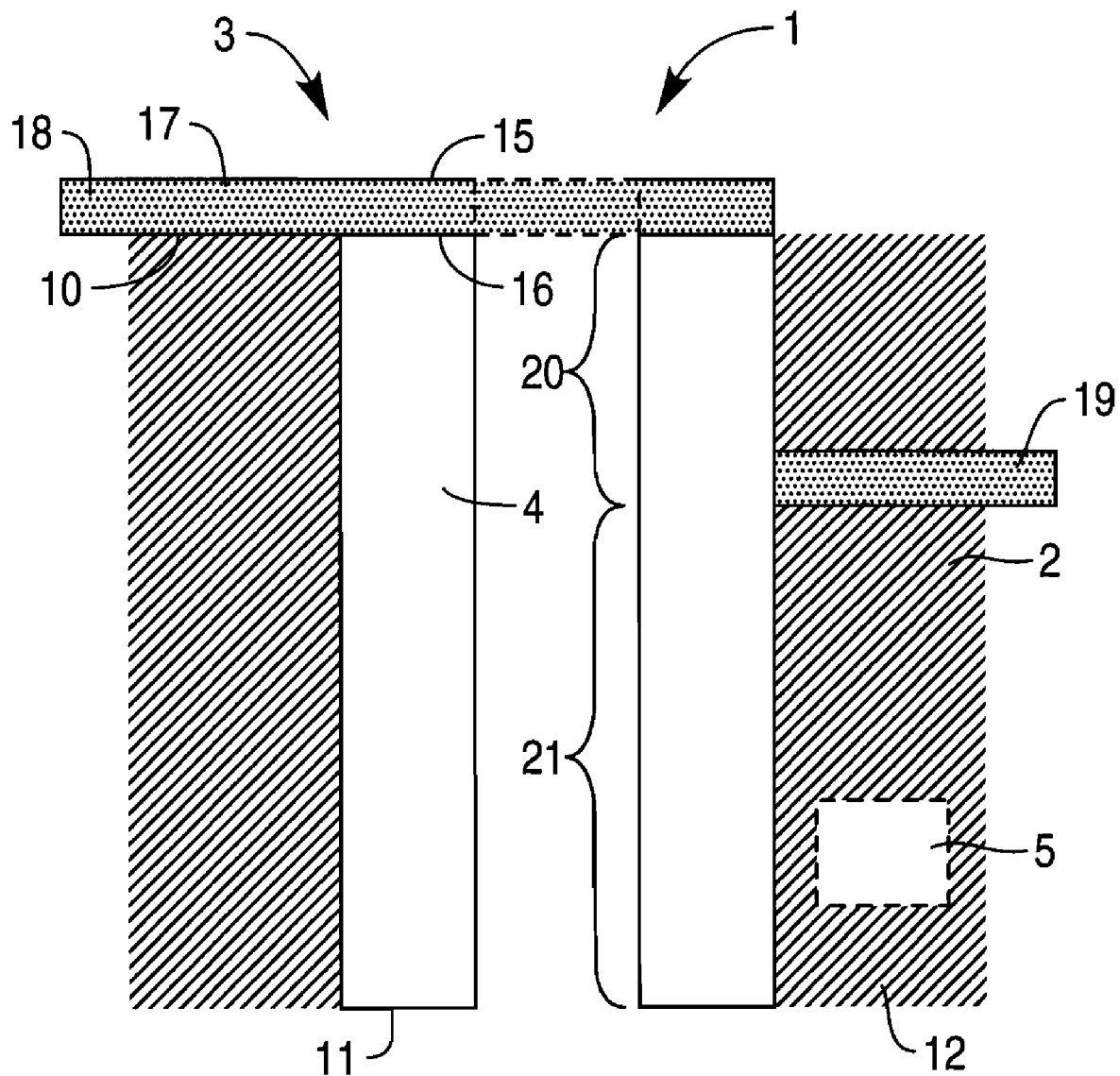
FIG. 4 is a cutaway view of a circuit board according to a further embodiment.

In FIG. 4, segments 18 and 19 are provided on vertically separated layers of substrate 2 to define a used portion 20 of stub 4, and hence a shortened unused portion 21. Stub 4 still has the same inherent resonant frequencies dependent upon its entire length. However, problematic resonant frequencies are dependant on the length of portion 21. In other words: inherent resonant frequencies occur where the length of portion 21 is n/4 wavelengths.

Referring again to FIG. 1, compensator element 5 is used to adjust the inherent resonant frequencies of stub 4. In a practical sense, this adjustment is typically configured to reduce the effect of resonant frequencies on a transmitted signal. For example: circuit board 1 is designed to carry a signal within a frequency range between X and Y, and stub 4 has an inherent resonant frequency A. For the sake of example, assume $X \leq A \leq Y$. Element 5 is used to adjust inherent resonant frequency A to define compensated resonant frequency B such that either Y<B or X>B. That is, the most adverse effects of via stub resonance are avoided for the relevant signal in board 1. It will be recognized that, for the adjustment to be practically advantageous, it controlled such that the frequency range does not include any compensated resonant frequencies. It is noted that this is not always possible with large frequency ranges.

In the present embodiment, compensation element 5 includes a capacitive element for loading the carried stub. The result of this loading is that values of inherent resonant frequencies are shifted lower to define lower compensated resonant frequencies. The larger the capacitance is added, the greater the downwards shift in frequency. However, since the physical length of the stubs remains unchanged, the spacing in frequency between two resonant frequencies remains unchanged.

If a signal to be transmitted on trace 15 has a spectrum bandwidth that is out of the resonant regions caused by stub 4, then the signal transmission is not substantively adversely affected. Advantageously, a digital signal usually has a spectrum within a limited bandwidth, and as such a board 1 is generally designable for a particular signal. Provided the signal spectrum is narrower than the spacing between two consecutive resonant frequencies, it is possible to tune the compensated resonant frequencies by providing element 5 with an appropriate amount of capacitance such that so that the most of the signal spectrum is out of the compensated resonant regions. By this approach, bandwidth specific circuit boards are designable. That is, a circuit board is designed having one or more capacitive elements 5 tuned to shift resonant frequencies of included PTH via stubs outside of a predetermined operating frequency range.

Several examples of particular implementations of element 5 are discussed below.

Figure 5:
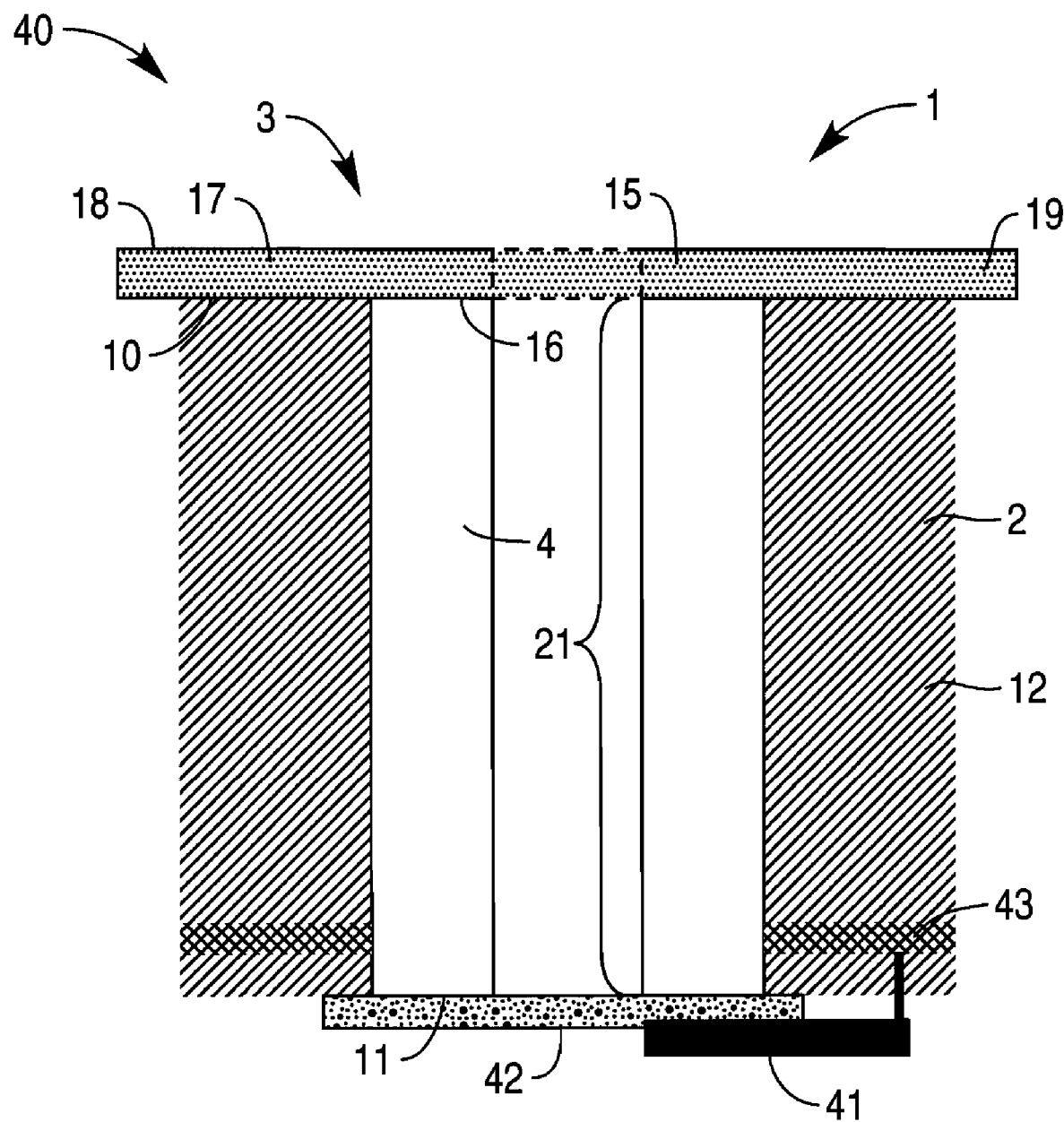
FIG. 5 is a cutaway view of a circuit board according to a further embodiment making use of a surface mount capacitor.

FIG. 5 illustrates a first implementation 40 that makes use of a surface mount capacitor 41. Capacitor 41 is mounted to surface 12 of substrate 2 to terminate stub 4. Conveniently, known PTH vias include a conductive pad 42 on surface 12, and capacitor 40 is mounted to that pad to terminate stub 4. More specifically, one end of capacitor 40 is soldered to pad 42, and the other end conductively connected to a reference plane, typically in the form of a ground plane 43.

It will be appreciated that mounting capacitor 41 to pad 42 is not essential. For example, some embodiments capacitor 41 is integrally defined in a purpose built pad 42, and in other embodiments capacitor 41 is mounted to surface 12 at a location spaced apart from and conductively associated with end 11. The underlying notion is capacitive termination of end 11, and alternate techniques for achieving this will be known to those skilled in the art.

Figure 6:
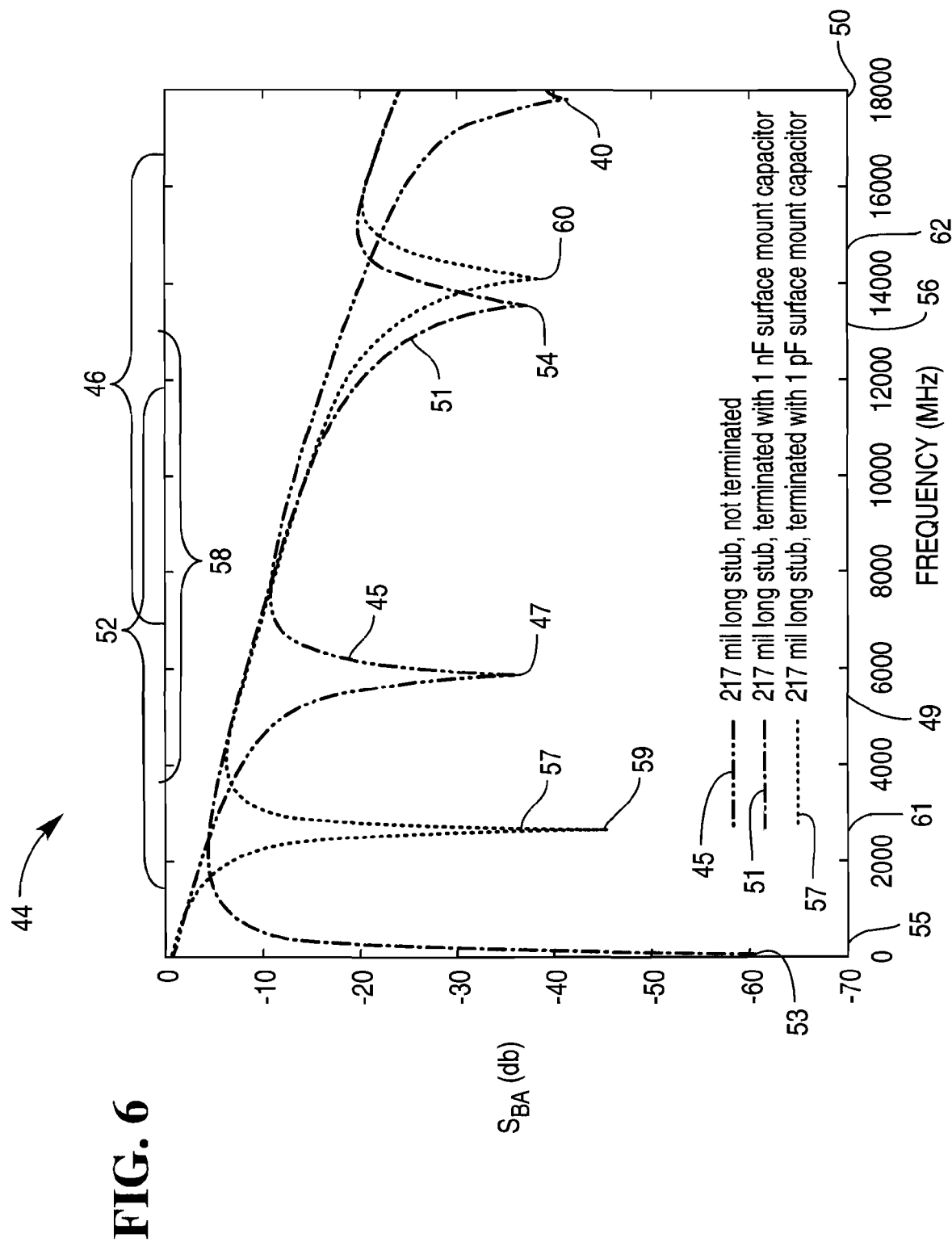
FIG. 6 is a graph showing the effect of embodiments of the invention in relation to signal loss behaviors for a trace across a PTH via.

FIG. 6 provides a graph 44 relevant to implementation 40. Graph 44 plots $|S_{BA}|$ for a 217 mm long stub 4 in three scenarios:

Scenario 45—stub 4 is not terminated (plotted by line 45). This represents a prior art circuit board suitable for signals in frequency range 46. Maximum losses 47 and 48 occur respectively at frequencies 49 and 50.

Scenario 51—stub 4 is terminated by a capacitor 41 in the form of a 1 nF surface mount capacitor (plotted by line 51). In this case, board 1 suitable for signals in frequency range 52. Maximum losses 53 and 54 occur respectively at frequencies 55 and 56.

Scenario 57—stub 4 is terminated by a capacitor 41 in the form of a 1 pF surface mount capacitor (plotted by line 57). In this case, board 1 suitable for signals in frequency range 58. Maximum losses 59 and 60 occur respectively at frequencies 61 and 62.

It will be appreciated that the term "suitable", insofar at it relates to a frequency range, designates a range that does not include any localized maximum losses, and substantially avoids adjacent regions for poor signal quality. What is practically regarded as "suitable" is ultimately subjective and varies between embodiments.

Figure 7:
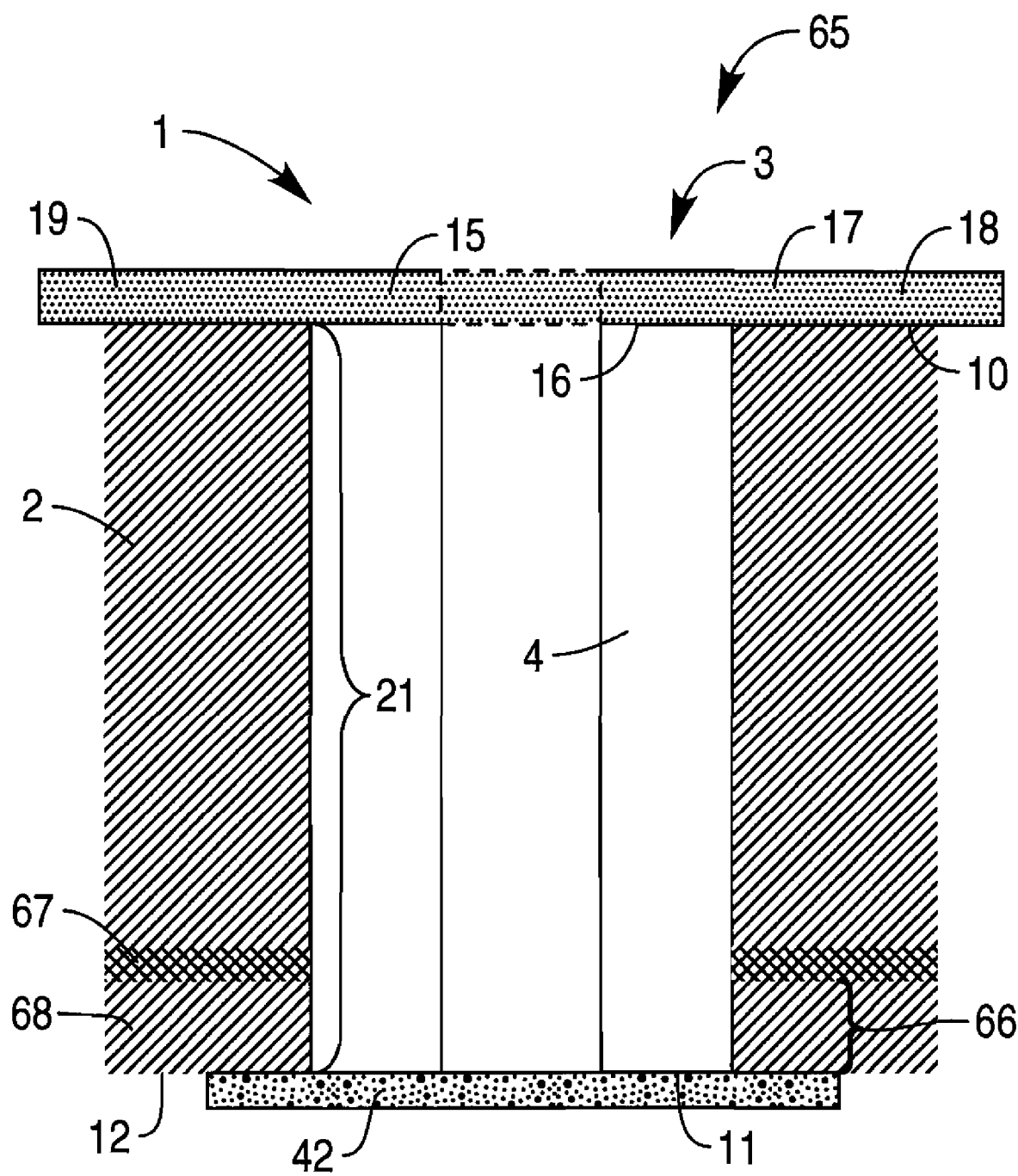
FIG. 7 is a cutaway view of a circuit board according to a further embodiment making use of a "virtual" capacitor.

FIG. 7 illustrates a second implementation 65. In this implementation, element 5 is a "virtual" capacitor 66 defined by a dielectric relationship between a metallic pad 42 and an adjacent ground plane 67 in substrate 2. Typically, plane 67 is a reference plane in the circuit board structure. Capacitor 66 is regarded as "virtual" given that it is not a distinct component. However, the capacitive affect is not virtual—it is real. This capacitive effect loads stub 4 to shift inherent resonant frequencies to lower adjusted values.

Given that pad 42, adjacent ground plane 67, and dielectrics 68 intermediate pad 42 and plane collectively provide a capacitance to capacitor 66, the capacitive value is influenced by:

The physical size of pad 42. For example: length, width, height, volume and shape. A larger pad results in higher capacitance.

The thickness of the dielectric layer, this being the distance between pad 42 and plane 66. A thinner dielectric layer results in a higher capacitance.

The dielectric constant of dielectric 68. A higher dielectric constant results in a higher capacitance.

All of these factors are conveniently selectable in when designing board 1. Those skilled in the art will recognize techniques for achieving various capacitive values. As such, the present disclosure provides for usage of implementation 65 to provide circuit boards suitable for various signal frequency ranges.

Implementation 65 has advantages over implementation 40 given that a discrete capacitive element is not required, which reduces physical size and manufacturing costs.

Figure 8:
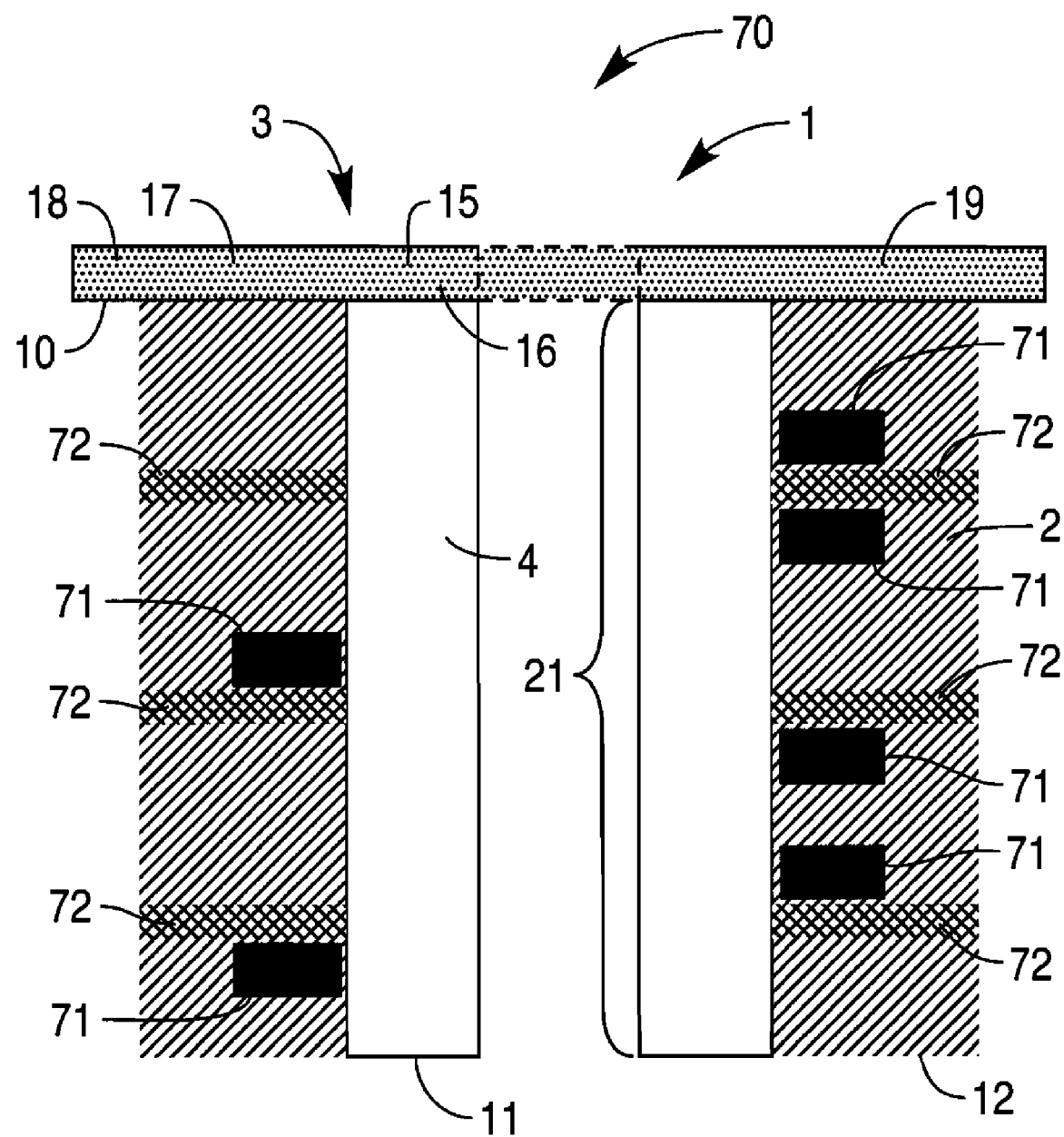
FIG. 8 is a cutaway view of a circuit board according to a further embodiment making use of an embedded singulated capacitor.

A third implementation 70 is illustrated in FIG. 8. In this case, element 5 takes the form of a discrete capacitor 71 embedded within substrate 2. Such a capacitor is also known as a singulated capacitor. Appropriate capacitors and techniques are known for allowing individual capacitor placement within a circuit board. For example, certain materials applied as a screen printable polymer thick film that is fired and etched.

For capacitor 71 to be effective in loading stub 4—and hence adjusting resonant frequencies—it is only required that the capacitive material be in close proximity of stub 4. That is, there need not be conductive contact between stub 4 and capacitor 71.

FIG. 8 illustrates a plurality of capacitors 71. Although a plurality is used in some embodiments, it is typically only necessary to use at most one capacitor for each stub 4. Indeed, those skilled in the art will appreciate that a single capacitor 71 is able to influence more than one stub 4, given appropriate placement. A plurality of capacitors 71 is shown simply for the sake of illustrating alternate placement locations, particularly relative to reference planes 72.

Known capacitors 71 are capable of achieving capacitances values on the order of 200 nF/cm$^2$. As such, large capacitance values are not readily realized. Where a larger capacitance is needed, capacitor 71 is positioned to straddle stub 4, or a plurality of capacitors 71 are used. Other approaches for increasing capacitance will be recognized by those skilled in the art.

Implementation 70 is advantageous when compared to above alternatives given that a pad 42 is not required. Those skilled in the art will recognize that, in some cases, it is preferential not to make use of a pad 42.

Figure 9:
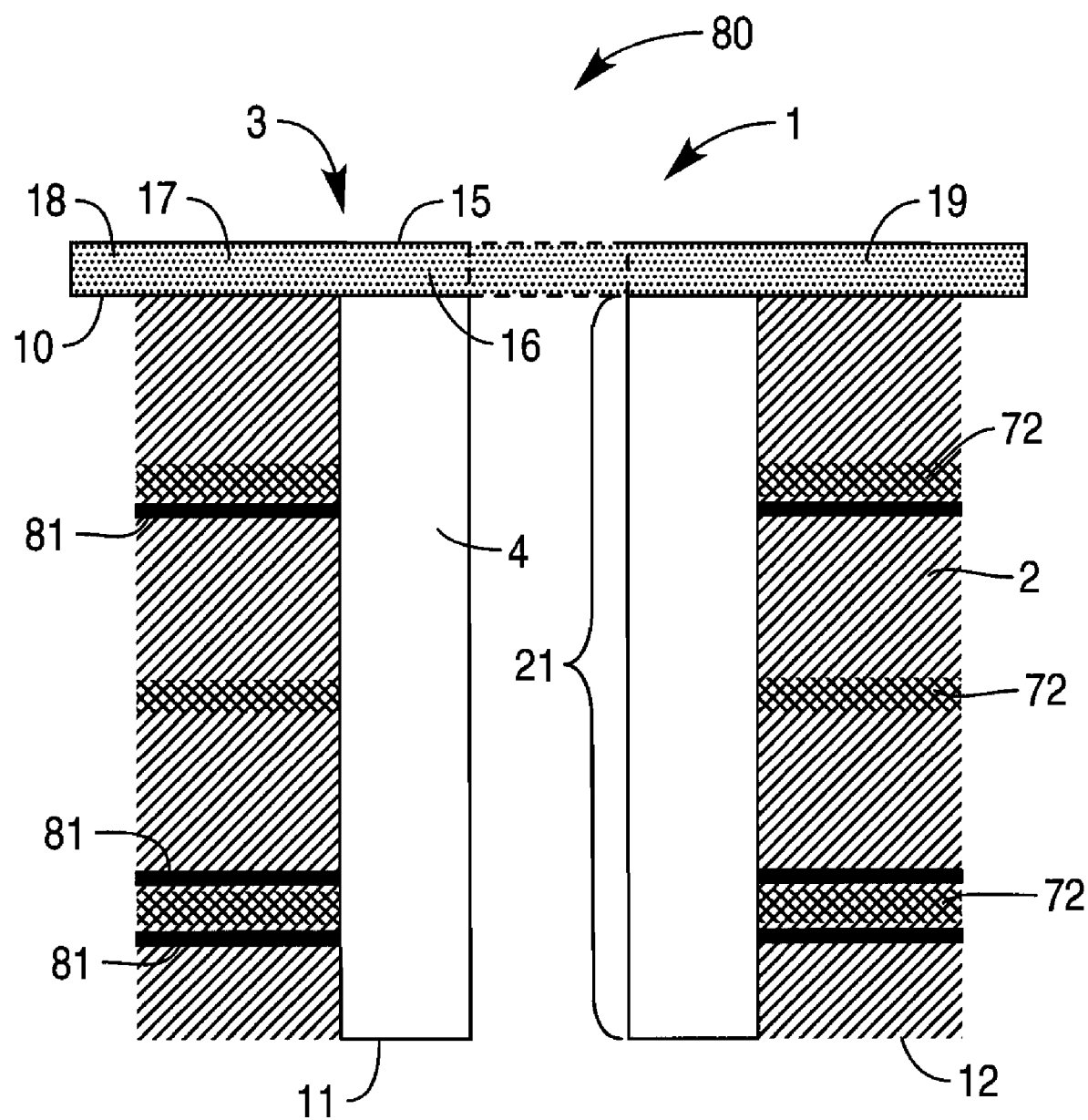
FIG. 9 is a cutaway view of a circuit board according to a further embodiment making use of a capacitive laminate.

Referring to FIG. 9, an implementation 80 makes use of an element 5 in the form of a capacitive laminate 81. As was the case with the above implementation, a number of laminates 81 are shown to indicate alternate positioning. It is appreciated that a single laminate is used in some cases, whereas in other cases two or more are used.

Although this laminate is shown as embedded within substrate 2, in some cases it defines surface 12. Similarly to above examples, laminate 81 loads stub 4 to adjust resonant frequencies. Known materials are capable of providing relatively high dielectric laminates. For example: DuPont Interra planar embedded capacitor laminate.

"DuPont" and "Interra" are trademarks of their respective owners, and not permission or affiliation is to be inferred.

This implementation is advantageous in that a single laminate 81 is able to influence all stubs 4 in a given circuit board.

In further embodiments laminate 81 is localized to a predefined planar region—such as a planar region proximal a stub 4. It will be recognized that such a technique is optionally used to form a singulated capacitor.

It will be appreciated that the above disclosure provides circuit boards particularly suited to use within a predetermined signal frequency bandwidth. Further, methods are provided for signal frequency responsive circuit board design.

Although the present invention has been described with particular reference to certain preferred embodiments thereof, variations and modifications of the present invention can be effected within the spirit and scope of the following claims.

What is claimed is:

1. A circuit board including:
   a substrate;
   a through-hole in the substrate for carrying a conductive via stub, the stub having an inherent stub characteristic, said inherent stub characteristic being an inherent resonant frequency; and
   a compensation element positioned on the substrate such that when the stub is carried by the through-hole the inherent stub characteristic is adjusted to define a compensated stub characteristic, said compensated stub characteristic being a compensated resonant frequency;
   wherein the stub includes a primary portion defined on a signal path for transmitting a signal having a predetermined signal frequency range and the compensated resonant frequency is outside of the predetermined signal frequency range.

2. A circuit board according to claim 1 wherein the inherent stub characteristic is adjusted to increase the suitability of the circuit board for a predetermined application.

3. A circuit board according to claim 1 wherein the compensation element includes a capacitive element for loading the carried stub.

4. A method for adjusting an inherent resonant frequency of a via stub when that stub is carried by a substrate, said stub including a primary portion defined on a signal path for transmitting a signal having a predetermined signal frequency range, the method including the steps of:
   providing a through-hole in the substrate for carrying the via stub; and
   positioning in the circuit board a compensation element for adjusting the inherent resonant frequency outside of said predetermined signal frequency range.

5. A circuit board for carrying a signal having a predefined bandwidth, the circuit board including:
   a plated through hole via having an inherent resonant frequency; and
   a compensation element for influencing the via such that the inherent resonant frequency is shifted outside of the predetermined bandwidth.

6. A circuit board according to claim 5 wherein the compensation element is a capacitive element.

* * * * *